(12) United States Patent
Meitl et al.

(10) Patent No.: US 10,917,953 B2
(45) Date of Patent: Feb. 9, 2021

(54) ELECTRICALLY PARALLEL FUSED LEDS

(71) Applicant: X Display Company Technology Limited, Dublin (IE)

(72) Inventors: Matthew Meitl, Durham, NC (US); Ronald S. Cok, Rochester, NY (US); Christopher Bower, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 107 days.

(21) Appl. No.: 15/704,630

(22) Filed: Sep. 14, 2017

(65) Prior Publication Data
US 2018/0007750 A1 Jan. 4, 2018

Related U.S. Application Data

(63) Continuation-in-part of application No. 15/438,319, filed on Feb. 21, 2017, now Pat. No. 10,223,962.
(Continued)

(51) Int. Cl.
*H05B 33/08* (2020.01)
*H05B 45/50* (2020.01)
(Continued)

(52) U.S. Cl.
CPC .......... *H05B 45/50* (2020.01); *H01L 22/24* (2013.01); *H01L 23/52* (2013.01);
(Continued)

(58) Field of Classification Search
CPC ............ G09G 3/32; G09G 2330/045; G09G 2330/08; G09G 2300/0452; G09G 3/2003;
(Continued)

(56) References Cited

U.S. PATENT DOCUMENTS 5,621,555 A 4/1997 Park
5,739,737 A * 4/1998 Hatton ............... H01H 85/26
337/206
(Continued)

FOREIGN PATENT DOCUMENTS

JP 2010091819 A * 4/2010 ............ G09G 3/36
JP 2011066130 A 3/2011
(Continued)

OTHER PUBLICATIONS

Hamer et al., 63.2: AMOLED Displays Using Transfer-Printed Integrated Circuits, SID 09 Digest, 40(2):947-950 (2009).
(Continued)

*Primary Examiner* — Amy Cohen Johnson
*Assistant Examiner* — Syed M Kaiser
(74) *Attorney, Agent, or Firm* — William R. Haulbrook; Michael D. Schmitt; Choate, Hall & Stewart LLP

(57) ABSTRACT

An LED component comprises a plurality of fused light-emitting diodes (LEDs) (e.g., micro-transfer printable or micro-transfer printed LEDs). Each fused LED comprises an LED with first and second LED electrical connections for providing power to the LED and a fuse with first and second fuse electrical connections. The first LED electrical connection is electrically connected to the first electrode. The first fuse electrical connection is electrically connected to the second LED electrical connection and the second fuse electrical connection is electrically connected to the second electrode. A fused LED source wafer comprises an LED wafer having a patterned sacrificial layer forming an array of sacrificial portions separated by anchors and a plurality of fused LED components, each fused LED component disposed entirely on or over a corresponding sacrificial portion. A light-emission system comprises a system substrate and a
(Continued)

plurality of fused LED components disposed on or over the system substrate.

12 Claims, 11 Drawing Sheets

Related U.S. Application Data

(60) Provisional application No. 62/311,288, filed on Mar. 21, 2016, provisional application No. 62/395,001, filed on Sep. 15, 2016.

(51) Int. Cl.
*H01L 27/15* (2006.01)
*G09G 3/34* (2006.01)
*H01L 21/66* (2006.01)
*H01L 33/62* (2010.01)
*H01L 27/02* (2006.01)
*H01L 23/52* (2006.01)

(52) U.S. Cl.
CPC ........ *H01L 27/0288* (2013.01); *H01L 27/153* (2013.01); *H01L 33/62* (2013.01); *G09G 3/3406* (2013.01); *G09G 2300/0426* (2013.01); *G09G 2330/045* (2013.01); *G09G 2330/08* (2013.01); *H01L 2933/0066* (2013.01)

(58) Field of Classification Search
CPC ........ G09G 2300/0426; G09L 27/0288; H05B 45/50; H01L 27/0288; H01L 27/153; H01L 22/24; H01L 23/52
See application file for complete search history.

(56) References Cited

U.S. PATENT DOCUMENTS

| | | | |
|---|---|---|---|
| 5,914,662 A * | 6/1999 | Burleigh | H02H 9/042 340/635 |
| 6,142,358 A | 11/2000 | Cohn et al. | |
| 6,577,367 B2 | 6/2003 | Kim | |
| 7,012,382 B2 | 3/2006 | Cheang et al. | |
| 7,195,733 B2 | 3/2007 | Rogers et al. | |
| 7,354,801 B2 | 4/2008 | Sugiyama et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 8,039,847 B2 | 10/2011 | Nuzzo et al. | |
| 8,440,546 B2 | 5/2013 | Nuzzo et al. | |
| 8,470,701 B2 | 6/2013 | Rogers et al. | |
| 8,506,867 B2 | 8/2013 | Menard | |
| 8,558,243 B2 | 10/2013 | Bibl et al. | |
| 8,722,458 B2 | 5/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,835,940 B2 | 9/2014 | Hu et al. | |
| 8,865,489 B2 | 10/2014 | Rogers et al. | |
| 8,889,485 B2 | 11/2014 | Bower | |
| 8,941,215 B2 | 1/2015 | Hu et al. | |
| 8,987,765 B2 | 3/2015 | Bibl et al. | |
| 9,105,714 B2 | 8/2015 | Hu et al. | |
| 9,111,464 B2 | 8/2015 | Bibl et al. | |
| 9,153,171 B2 | 10/2015 | Sakariya et al. | |
| 9,161,448 B2 | 10/2015 | Menard et al. | |
| 9,166,114 B2 | 10/2015 | Hu et al. | |
| 9,178,123 B2 | 11/2015 | Sakariya et al. | |
| 9,217,541 B2 | 12/2015 | Bathurst et al. | |
| 9,226,361 B2 | 12/2015 | Toth | |
| 9,240,397 B2 | 1/2016 | Bibl et al. | |
| 9,252,375 B2 | 2/2016 | Bibl et al. | |
| 9,358,775 B2 | 6/2016 | Bower et al. | |
| 9,412,727 B2 | 8/2016 | Menard et al. | |
| 9,420,644 B1 * | 8/2016 | Shum | F21V 23/003 |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,534,773 B1 * | 1/2017 | Turudic | F21K 9/238 |
| 9,555,644 B2 | 1/2017 | Rogers et al. | |
| 9,583,533 B2 | 2/2017 | Hu et al. | |
| 9,601,356 B2 | 3/2017 | Bower et al. | |
| 9,626,908 B2 | 4/2017 | Sakariya et al. | |
| 9,640,715 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,865,832 B2 | 1/2018 | Bibl et al. | |
| 9,929,053 B2 | 3/2018 | Bower et al. | |
| 9,980,341 B2 | 5/2018 | Bower et al. | |
| 2002/0036471 A1 * | 3/2002 | Silvestre | G09G 3/30 315/160 |
| 2004/0183067 A1 | 9/2004 | Strip | |
| 2005/0024877 A1 * | 2/2005 | Frederick | F21S 9/04 362/277 |
| 2005/0082673 A1 * | 4/2005 | Fujiwara | B41J 2/45 257/758 |
| 2005/0174064 A1 * | 8/2005 | Agostinelli | G09G 3/3216 315/169.3 |
| 2005/0264472 A1 | 12/2005 | Rast | |
| 2006/0238466 A1 * | 10/2006 | Chen | G09G 3/3406 345/82 |
| 2007/0295973 A1 * | 12/2007 | Jinbo | H01L 27/1214 257/88 |
| 2008/0290814 A1 * | 11/2008 | Leong | F21K 9/00 315/294 |
| 2009/0009362 A1 * | 1/2009 | Miller | H05B 33/0803 340/907 |
| 2011/0140618 A1 * | 6/2011 | Wang | H05B 45/395 315/193 |
| 2011/0175699 A1 * | 7/2011 | Huss | H01H 85/32 337/143 |
| 2011/0241719 A1 * | 10/2011 | Shr | H02S 50/10 324/761.01 |
| 2013/0051001 A1 * | 2/2013 | Miskin | H05B 45/00 362/227 |
| 2013/0193851 A1 * | 8/2013 | Alon | H03H 7/00 315/121 |
| 2013/0278144 A1 | 10/2013 | Levermore et al. | |
| 2013/0335397 A1 * | 12/2013 | Kim | G09G 3/006 345/212 |
| 2014/0092514 A1 * | 4/2014 | Chen | H01C 7/12 361/118 |
| 2014/0159043 A1 | 6/2014 | Sakariya et al. | |
| 2014/0217448 A1 | 8/2014 | Kim et al. | |
| 2014/0304961 A1 * | 10/2014 | Cherry | H05B 33/089 29/402.09 |
| 2015/0117039 A1 * | 4/2015 | Yang | F21V 19/0055 362/382 |
| 2015/0169011 A1 | 6/2015 | Bibl et al. | |
| 2015/0371585 A1 | 12/2015 | Bower et al. | |
| 2016/0013252 A1 | 1/2016 | Wang | |
| 2016/0019832 A1 * | 1/2016 | Nakanishi | G09G 5/02 345/690 |
| 2016/0035924 A1 * | 2/2016 | Oraw | H05K 1/189 136/244 |
| 2016/0056725 A1 | 2/2016 | Kim et al. | |
| 2016/0057822 A1 | 2/2016 | Chu | |
| 2016/0057827 A1 | 2/2016 | Miskin | |
| 2016/0057832 A1 | 2/2016 | Briggs et al. | |
| 2016/0091147 A1 * | 3/2016 | Jiang | F21K 9/275 315/205 |
| 2016/0093600 A1 | 3/2016 | Bower et al. | |
| 2016/0169462 A1 * | 6/2016 | Hawkins | G01N 21/8806 362/219 |

(56) References Cited

U.S. PATENT DOCUMENTS

| | | | |
|---|---|---|---|
| 2016/0178174 A1* | 6/2016 | Fujita | F21S 8/02 |
| | | | 362/249.06 |
| 2016/0180758 A1* | 6/2016 | Buckley | G09G 3/2003 |
| | | | 345/691 |
| 2016/0242685 A1* | 8/2016 | DeHennis | A61B 5/14532 |
| 2016/0351104 A1* | 12/2016 | Yaras | G09G 3/2022 |
| 2017/0027028 A1* | 1/2017 | Segers | H05B 33/0809 |
| 2017/0039961 A1* | 2/2017 | Sasagawa | G09G 3/3433 |
| 2017/0191626 A1* | 7/2017 | Tong | F21V 21/008 |
| 2017/0206845 A1 | 7/2017 | Sakariya et al. | |
| 2017/0270852 A1 | 9/2017 | Meitl et al. | |
| 2017/0303353 A1* | 10/2017 | Guang | F21V 23/00 |
| 2017/0338374 A1 | 11/2017 | Zou et al. | |
| 2018/0084614 A1* | 3/2018 | Bower | H05B 33/089 |
| 2019/0014631 A1* | 1/2019 | Van Delden | H05B 33/0821 |

FOREIGN PATENT DOCUMENTS

| | | |
|---|---|---|
| WO | WO-2005/078691 A2 | 8/2005 |
| WO | WO-2014/149864 A1 | 9/2014 |
| WO | WO-2017/162629 A1 | 9/2017 |

OTHER PUBLICATIONS

International Search Report, PCT/EP2017/056628, 3 pages, dated Jun. 27, 2017.
Written Opinion, PCT/EP2017/056628, 9 pages, dated Jun. 27, 2017.
Bower, C. A. et al., Transfer Printing: An Approach for Massively Parallel Assembly of Microscale Devices, IEE, Electronic Components and Technology Conference, 2008, pp. 1105-1109.
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341 (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100, (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

\* cited by examiner

ELECTRICALLY PARALLEL FUSED LEDS

RELATED APPLICATIONS

This application claims priority to U.S. Provisional Patent Application No. 62/395,001, filed Sep. 15, 2016, titled "Electrically Parallel Fused LEDs," and this application is a continuation-in-part of U.S. patent application Ser. No. 15/438,319, filed Feb. 21, 2017, entitled "Display with Fused LEDs", which claims priority to U.S. Provisional Patent Application No. 62/311,288, filed Mar. 21, 2016, titled "Display with Fused LEDs," the contents of all of which are hereby incorporated by reference herein in their entirety.

FIELD OF THE INVENTION

The present invention relates generally to fused assemblies of inorganic light-emitting diodes.

BACKGROUND OF THE INVENTION

Light-emitting diodes (LEDs) are widely used in lamps, as indicators in electronic devices, and in large-format displays. For example, displays using LEDs are found in outdoor signage and stadium displays. Inorganic light-emitting diode displays using inorganic micro-LEDs on a display substrate are also known. Micro-LEDs can have an area less than 1 mm square, less than 100 microns square, or less than 50 microns square or have an area small enough that it is not visible to an unaided observer of the display at a designed viewing distance. U.S. Pat. No. 8,722,458 entitled Optical Systems Fabricated by Printing-Based Assembly teaches transferring light-emitting, light-sensing, or light-collecting semiconductor elements from a wafer substrate to a system substrate.

In any application requiring many elements, it is important that each element is reliable to ensure good manufacturing yields and performance. Because no manufacturing process is perfect, any large system can have defective elements. In particular, systems comprising inorganic light-emitting diodes are subject to manufacturing defects that increase the amount of current passing through the LED when provided with power, resulting in an undesirable brightness, power usage, or system control problems.

An undesired increase in current can also overheat the LEDs. One approach to preventing such overheating is to provide each LED with a resistor or group of resistors in series with the LED, as is described in U.S. Pat. No. 9,226,361. U.S. Patent Application Publication No. 20160057827 discloses a current-limiting diode in an LED circuit for a lighting system with both forward-biased and reverse-biased LEDs and a polarity switching device. Circuits for sensing current levels and reducing power dissipation are also known, for example as taught in U.S. Patent Application Publication Nos. 20160057822 and 20160057832, as are voltage control circuits, for example as described in U.S. Patent Application Publication No. 20160056725. However, these approaches either require complex or expensive circuit components in association with each LED or result in diminished light output.

Alternatively, to ensure that large multi-element systems are reliably manufactured and operated, such systems can employ redundant elements. For example, displays are sometimes designed with redundant light emitters. U.S. Pat. No. 5,621,555 describes an LCD with redundant pixel electrodes and thin-film transistors to reduce defects. In another approach described in U.S. Pat. No. 6,577,367, an extra row or column of pixels is provided to replace any defective row or column. An alternative approach to improving display yields uses additional, redundant light-emitting elements, for example two light emitters for every desired light emitter in the display. U.S. Pat. No. 8,766,970 discloses a pixel circuit with two sub-pixels and circuitry to determine whether a sub-pixel is to be enabled, for example if another sub-pixel is faulty. Similarly, U.S. Pat. No. 7,012,382 teaches an LED-based lighting system that includes a primary light source and at least one redundant light source. The primary light source is activated by itself and the performance of the light source is measured to determine whether or not to drive the redundant light source. The redundant light source is activated when the performance measurements indicate that a performance characteristic is not being met by the primary light source alone. The first light system can be activated in combination with the redundant light source once the decision is made to activate the redundant light source. U.S. Pat. No. 8,791,474 discloses redundant pairs of micro LED devices driven by a common transistor. WO 2014149864 describes separately controlled micro-LED devices. However, the use of redundant emitters is expensive and does not address problems with LEDs that conduct too much current.

There is a need, therefore, for LED circuits that can control or avoid problems resulting from LEDs in a display, lamp, or other light-emitting device that undesirably conduct too much current.

SUMMARY OF THE INVENTION

The present invention includes embodiments of a fused LED component comprising a plurality of fused light-emitting diodes (LEDs) (e.g., micro-transfer printable or micro-transfer printed LEDs). Each fused LED comprises an LED with first and second LED electrical connections for providing power to the LED from first and second electrodes to cause the LED to emit light. The first LED electrical connection is electrically connected to the first electrode. A fuse comprises first and second fuse electrical connections. The first fuse electrical connection is electrically connected to the second LED electrical connection and the second fuse electrical connection is electrically connected to the second electrode so that a fuse and LED of each fused LED are serially connected and fused LEDs in a fused LED component are electrically connected in parallel. A display can incorporate an array of fused LED components and an illumination system can incorporate one or more fused LED components. Other devices can include one or more than one suitably arranged fused LED components.

A fused LED source wafer having micro-transfer printable fused LEDs comprises a component wafer having a patterned sacrificial layer forming an array of sacrificial portions separated by anchors and a plurality of fused LEDs, each fused LED disposed entirely on or over a corresponding sacrificial portion.

A method of making and operating a micro-transfer printable fused LED component comprises providing a fused LED component, wherein one of the LEDs in the fused LED component is a defective LED having an electrical short, and applying electrical power to the first and second electrodes so that the fuse associated with the defective LED is rendered non-conductive.

In various embodiments of the present invention, LEDs in a fused LED component all emit substantially the same color of light (e.g., the emission wavelengths of the LEDs deviate no more than 20% from each other, e.g., no more than 15%, 10%, 5%, 2%, or 1%) or a combination of the LEDs together emit light that is perceived by the human visual system as white light.

In some embodiments, an LED of the plurality of fused LEDs is a first LED and one or more of the fused LEDs includes a second LED with first and second LED electrical connections for providing power to the second LED to cause the second LED to emit light. The first LED electrical connection of the first LED is electrically connected in common with the first electrical connection of the second LED and the second LED electrical connection of the first LED is electrically connected in common with the second LED electrical connection of the second LED so that the first and second LEDs are electrically connected in parallel. In some embodiments, one or more of the fused LEDs includes a third LED with first and second LED electrical connections for providing power to the third LED to cause the LED to emit light. The first LED electrical connection of the first LED is electrically connected in common with the first electrical connection of the third LED and the second LED electrical connection of the first LED is electrically connected in common with the second LED electrical connection of the third LED so that the first, second, and third LEDs are electrically connected in parallel. One or more of the fused LEDs can emit light perceived to be white by the human visual system. Alternatively, the fused LEDs can each emit a different color of light or the fused LEDs can emit the same color of light.

In some embodiments, the fused LED component is a first fused LED component and an embodiment of the present invention includes a second fused LED component. The LEDs of the first fused LED component can emit light of a first color and the LEDs of the second fused LED component can emit light of a second color different from the first color. Furthermore, the present invention includes embodiments wherein a third fused LED component and the LEDs of the third fused LED component can emit light of a third color different from the first color and different from the second color. The first electrode of the first fused LED component can be electrically connected in common with the first electrode of the second fused LED component or the third fused LED component, or both. The second electrodes of the first, second, or third fused LED components can be electrically connected in common, or not.

In some embodiments, the fused LED component includes first and second connection posts. The first connection post is electrically connected to the first electrode or the second connection post is electrically connected to the second electrode.

In some embodiments, the fused LED component includes a component substrate on which the fused LEDs and at least a portion of the first electrode and the second electrode are disposed.

In some embodiments, one of the fuses is not electrically conductive.

In various embodiments of the present invention, the fused micro-transfer printable LED component can include five or more fused LEDs, ten or more fused LEDs, twenty or more fused LEDs, fifty or more fused LEDs, or one hundred or more fused LEDs.

Each fused LED can include a replacement fuse having first and second fuse electrical connections. The second fuse electrical connection of the replacement fuse is electrically connected to the second fuse electrical connection of the fuse. In an embodiment, one or more of the fused LEDs includes a replacement LED having first and second LED electrical connections. The first LED electrical connection of the replacement LED is electrically connected to the first LED electrical connection of the LED. In a further embodiment, each fused LED can include first, second, or third pads. The first pad can be electrically connected to the first electrode or the first LED electrical connection. The second pad can be electrically connected to the second fuse electrical connection or the second electrode. The third pad can be electrically connected to the first fuse electrical connection or the second LED electrical connection. The replacement LED can be micro-transfer printed across the first and second pads, the replacement fuse can be micro-transfer printed across the second and third pads, or a fused LED can be micro-transfer printed across the first and third pads.

A light-emission system having fused light-emitting diodes can include a system substrate and one or more fused LED components disposed on or over the system substrate (e.g., arranged in an array, such as a regular array). The light-emission system can comprise a plurality of component substrates on each of which a corresponding fused LED is disposed, wherein the component substrates are disposed on or over the system substrate. In some embodiments, one of the fuses is not electrically conductive.

A fused LED source wafer having one or more micro-transfer printable fused LEDs comprises a component wafer having a patterned sacrificial layer forming an array of sacrificial portions separated by anchors with a plurality of LED components. A fused LED is disposed entirely on or over each corresponding sacrificial portion. Each fused LED can include a component substrate on which the fuse and the LED are disposed.

A method of making a fused micro-transfer printable LED component includes providing a fused micro-transfer printable LED component, wherein one of the LEDs is a defective LED having an electrical short and applying electrical power to the first and second electrodes so that the fuse associated with the defective LED is rendered non-conductive. In some embodiments, a replacement LED is provided and electrically connected to the first and second pads, for example by micro-transfer printing. In some embodiments, an electrical jumper is provided across the fuse associated with a non-defective LED. The electrical jumper is in electrical contact with the second electrode and the second electrical connection of each non-defective fused LEDs. In some embodiments, a replacement fused LED is provided and micro-transfer printed across the first and third pads. In some embodiments, a replacement fused LED is provided and the first LED electrical connection of the replacement fused LED is electrically connected to the first LED electrical connection of the first LED and the second fuse electrical connection of the replacement fused LED is electrically connected to the second fuse electrical connection of the first fuse.

In some embodiments, a light emission standard is provided, the light output of each LED is tested and compared to the light-emission standard, and each LED is determined to meet, or not meet, the standard. If the LED does not meet the standard, at least one of the first and second LED electrical connection and first and second LED electrical connection is rendered non-conductive.

In some embodiments, the LEDs, the fuses, the fused LEDs or LED components are provided or printed using micro-transfer printing and any one or more of the LEDs, the fuses, the fused LEDs, or fused LED components includes at least a portion of a tether or a broken (e.g., fractured) tether.

Certain embodiments of the present invention provide a simple way to overcome LED manufacturing faults in an LED component and enables simple detection, correction, and repair of the component.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 2:
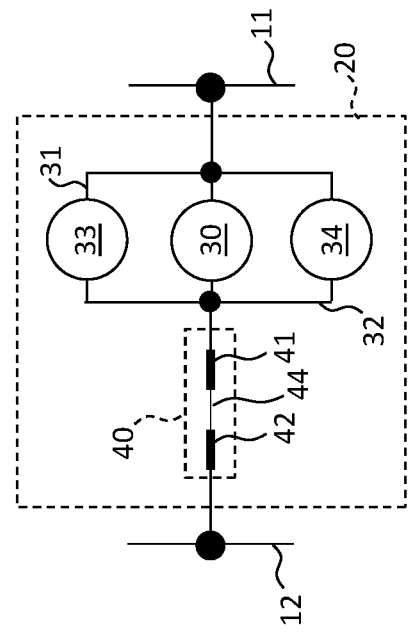
FIG. 2 is a schematic illustration of a fused LED component with multiple parallel-connected LEDs according to an illustrative embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides systems, apparatus, and methods to overcome LED manufacturing faults in an LED component and enables simple detection, correction, and repair of the LED component by including one or more fuses electrically connected to one or more LEDs. The fused LED components can be used in a wide variety of applications, including displays, area lighting, and indicators.

Figure 1:
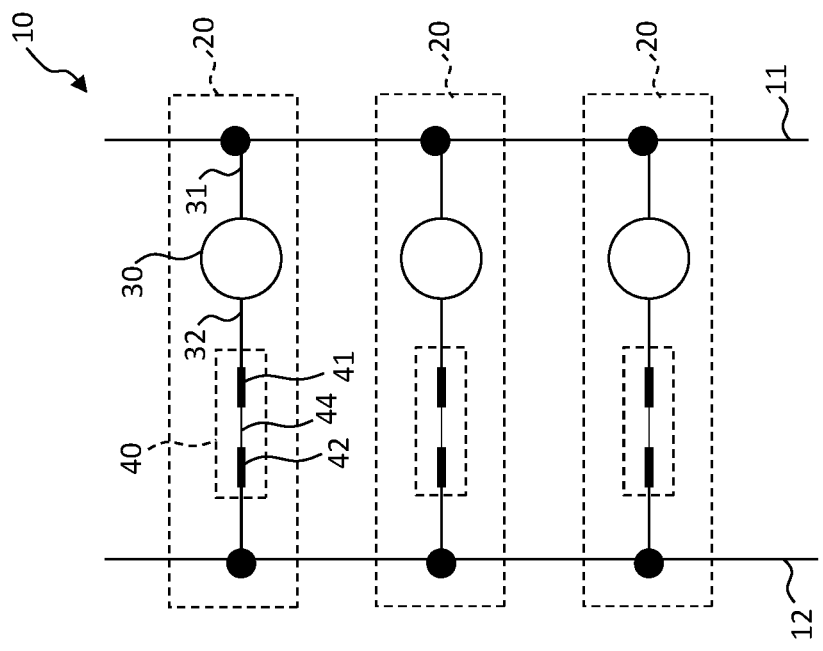
FIG. 1 is a schematic illustration of fused LED components in an illustrative embodiment of the present invention.
Figure 3:
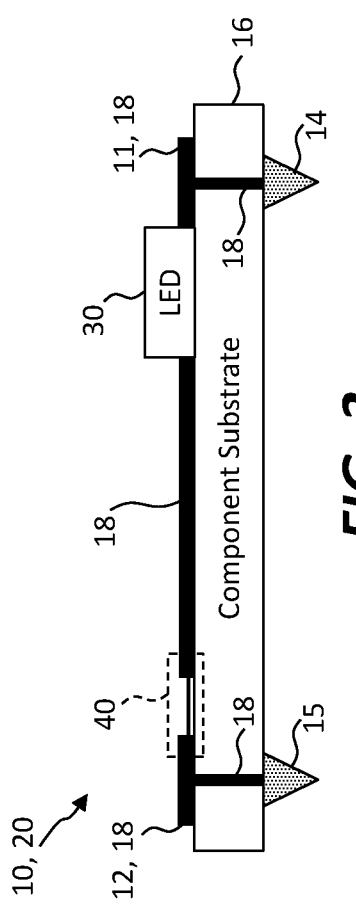
FIG. 3 is a schematic cross section of a fused LED and fused LED component according to an illustrative embodiment of the present invention.

Referring to FIG. 1, in some embodiments of the present invention, a fused light-emitting diode (LED) component 10 includes a first electrode 11 and a second electrode 12 connected to a plurality of fused LEDs 20. Each fused LED 20 in the plurality of fused LEDs 20 includes a light-emitting diode (LED) 30 with first and second LED electrical connections 31, 32 for providing power to the LED 30 to cause the LED 30 to emit light. The first LED electrical connection 31 is electrically connected to the first electrode 11. A fuse 40 includes first and second fuse electrical connections 41, 42, and an electrical conductor connected between the first and second fuse electrical connections 41, 42 that can be rendered non-conductive, for example, fuse wire 44 having a predetermined electrical resistance and current-carrying capacity. The first fuse electrical connection 41 is electrically connected to the second LED electrical connection 32 and the second fuse electrical connection 42 is electrically connected to the second electrode 12. Thus, the fused LEDs 20 are electrically connected in parallel between the first and second electrodes 11, 12. The first and second electrodes 11, 12, the first and second fuse electrical connections 41, 42, and the first and second LED electrical connections 31, 32 can be, for example, metal wires 18 as shown in FIG. 3, and the LED 30 can be a solid-state semiconductor structure, for example incorporating one or more layers of semiconductors or compound semiconductors, each with or without dopants, all of which can be formed or assembled on an underlying substrate or printed circuit board (e.g., component substrate 16 in FIG. 3) using micro-transfer printing or photolithographic materials and methods.

In some embodiments of the present invention, each LED 30 of the fused LEDs 20 emits substantially the same color of light so that all of the LEDs 30 together emit one color of light, for example a primary color of light, such as red, green, blue, or yellow. Alternatively, the LEDs 30 emit a plurality of different colors of light that are together perceived by the human visual systems as a composite color of light (e.g., white light). In some embodiments, individual LEDs 30 of different fused LEDs 20 can emit different colors of light, for example red, green, yellow, cyan, or blue light. In some embodiments, one or more of the LEDs 30 can include color-change material(s), such as phosphors (e.g., yellow-light-emitting phosphors) and/or quantum dots, to down-convert light emitted by the LED 30 (e.g., blue light) itself so that the LED 30 and color-change material(s) together emit light perceived to be a composite color of light (e.g., white light) by the human visual system.

The LEDs 30 of the fused LEDs 20 are operated by providing electrical power to the first and second electrodes 11, 12, for example from an external power source (not shown). Electrical current passes through the fuses 40 and the LEDs 30, causing the LEDs 30 to emit light.

Each fused LED 20 can include one or more LEDs 30, for example two or three LEDs. As shown in FIG. 2, a fused LED 20 has first, second, and third LEDs 30, 33, 34, each having first LED electrical connections 31 electrically connected together and second LED electrical connections 32 electrically connected together so that the first, second, and third LEDs 30, 33, 34 are electrically connected in parallel. Thus, according to some embodiments of the present invention, the LED 30 of the plurality of fused LEDs 20 is a first LED 30. One or more of the fused LEDs 20 includes a second LED 33 with first and second LED electrical connections 31, 32 for providing power to the second LED 33 to cause the second LED 33 to emit light. The first LED electrical connection 31 of the first LED 30 is electrically connected in common with the first electrical connection 31 of the second LED 33 and the second LED electrical connection 32 of the first LED 30 is electrically connected in common with the second LED electrical connection 32 of the second LED 33 so that the first and second LEDs 30, 33 are electrically connected in parallel. As used herein, two or more elements, electrodes, or electrical connections "electrically connected in common" means that they are electrically connected, directly or indirectly, to a single electrode or electrical connection. For example, as shown in FIG. 2, first electrical connections 31 of LEDs 30, 33, and 34 are all electrically connected to electrode 11 and second electrical connections 32 of LEDs 30, 33, and 34 are all electrically connected to electrode 12 through fuse 40. Therefore, the first electrical connections 31 are connected in common and the second electrical connections 32 are connected in common.

In some embodiments, and as shown in FIG. 2, one or more of the fused LEDs 20 includes a third LED 34 with first and second LED electrical connections 31, 32 for providing power to the third LED 34 to cause the third LED 34 to emit light. The first LED electrical connection 31 of the first LED 30 is electrically connected in common with the first electrical connection 31 of the third LED 34 and the second LED electrical connection 32 of the first LED 30 is electrically connected in common with the second LED electrical connection 32 of the third LED 34 so that the first, second, and third LEDs 30, 33, 34 are electrically connected in parallel.

In some embodiments, first, second, and third LEDs 30, 33, 34 emit the same color of light, for example a primary color. In some embodiments, the first, second, and third LEDs 30, 33, 34 emit different colors of light. The different colors of light can, in some embodiments, be perceived together as white light by the human visual system. In some embodiments, the different colors of light together can be perceived together as colored light by the human visual system. For example, the perceived colored light can be a combination of the colors emitted by one or more LEDs. An arrangement of first, second, and third LEDs 30, 33, 34, in accordance with the illustrative embodiment shown in FIG. 2, enables light perceived to be a desired color to be emitted from the fused LED 20, even if single LEDs 30 having desired light-emission characteristics (e.g., a desired wavelength of emission) are not available. In accordance with the illustrative embodiment of FIG. 1, in some embodiments of the present invention, one or more of LEDs 30 can include color-change materials such as phosphors (e.g., yellow-light-emitting phosphors) and/or quantum dots, to down-convert light emitted by the LED 30 (e.g., blue light) itself so that the one or more LEDs 30 and color-change material(s) together emit light perceived to be a composite color of light (e.g., white light) by the human visual system. White light perceived from one or more LEDs 30 can have a desired color temperature.

Figure 9:
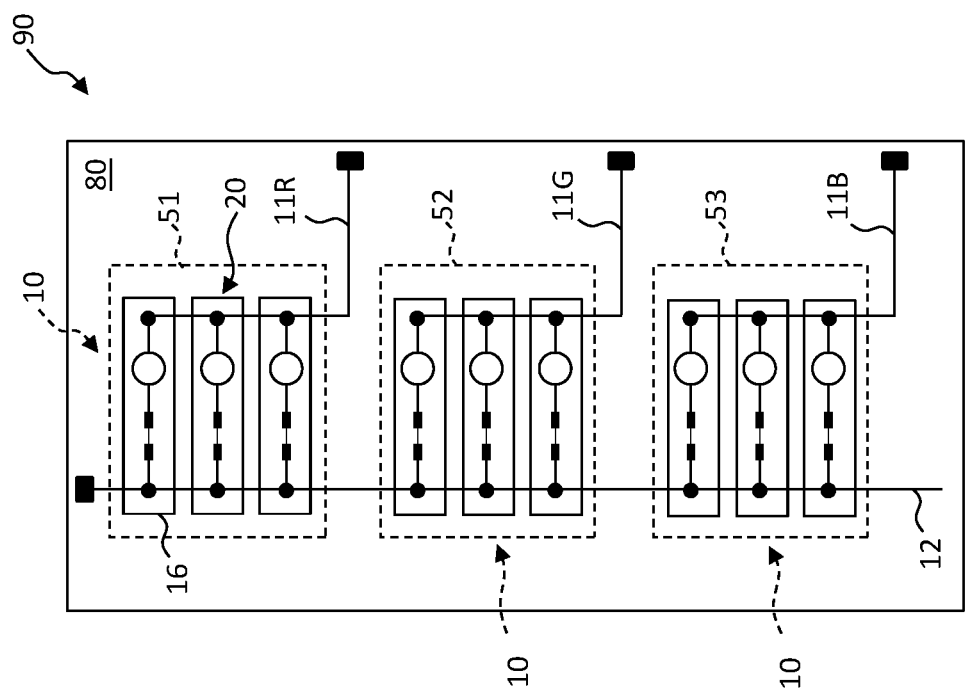
FIG. 9 is a schematic illustration of a light emission system having fused LED components according to an illustrative embodiment of the present invention.
Figure 12:
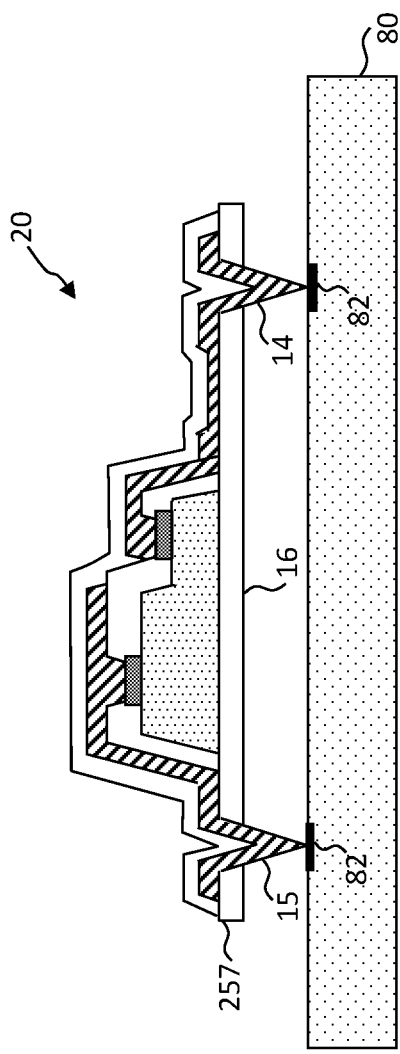
FIG. 12 is a schematic cross section illustrating a micro-transfer printed fused LED in electrical connection with contact pads on a system substrate according to illustrative embodiments of the present invention.

In some embodiments, a fused LED component 10 a fused LED 20 or both can be a micro-transfer printable fused LED component 10 or fused LED 20 micro-transfer printed from a fused LED component source wafer or fused LED source wafer (as discussed further below). In some embodiments, LEDs 30 can be micro-transfer printed from an LED source wafer and/or fuses 40 can be micro-transfer printed from a fuse source wafer to a fused LED 20 component substrate 16 or a fused LED component 10 component substrate 16. An exemplary component substrate 16 is shown in FIG. 3. Referring to FIG. 3, in an illustrative embodiment of the present invention, at least one fused LED 20 in a fused LED component 10 includes a plurality of connection posts, for example but not limited to first and second connection posts 14, 15. In FIG. 3, the first connection post 14 is electrically connected to at least a portion of the first electrode 11 and the second connection post 15 is electrically connected to at least a portion of the second electrode 12. A fused LED component 10 can include one or more component substrates 16 on which one or more fused LEDs 20 and at least a portion of the first electrode 11 and the second electrode 12 are disposed. The illustration of FIG. 3 can represent an entire, individual fused LED 20 structure in a fused LED component 10 that includes multiple fused LEDs 20, each of which has an individual and separate component substrate 16, for example as shown in FIGS. 9 and 12, described below, or mounted on a module substrate 84 as described further below with respect to FIGS. 14 and 15. Alternatively, multiple fused LEDs 20 can have a common component substrate 16 in a fused LED component 10. In some embodiments, all fused LEDs 20 share a single component substrate 16, in which case the component substrate 16 and the module substrate 84 (as described below) are the same substrate.

Figure 14:
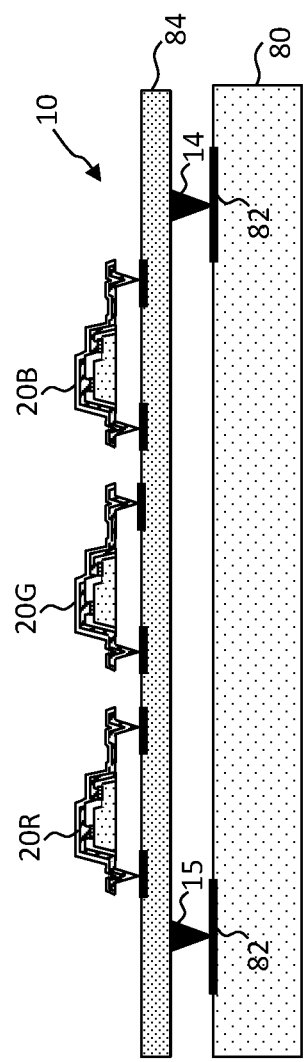
FIG. 14 is a schematic cross section illustrating a fused LED component on a system substrate according to illustrative embodiments of the present invention.

Fused LEDs 20 can each be micro-transfer printable and electrically connected to one or more contact pads 82 on a system substrate 80, as illustrated in FIG. 12, or module substrate 84, as illustrated in FIG. 14, by micro-transfer printing. In some embodiments, a fused LED component 10 with first and second connection posts 14, 15 is a micro-transfer printable fused LED component 10 that is electrically connected to one or more contact pads 82 on a system substrate 80, as illustrated in FIG. 14, by transfer printing (e.g., micro-transfer printing). In some embodiments, each fused LED 20 includes first and second connection posts 14, 15, has a component substrate 16, and is a transfer printable (e.g., micro-transfer printable) element. LEDs 30, and, optionally, fuses 40, can be transfer printed (e.g., micro-transfer printed) to a component substrate 16 and electrically connected, for example, by using photolithographic processes and materials to form wires 18, as illustrated in FIG. 3. Fuses 40 can alternatively be made directly on a substrate using photolithographic processes. By using first and second connection posts 14, 15, subsequent photolithographic processes are unnecessary to electrically connect first and second electrodes 11, 12 on a system substrate 80. In some embodiments, this reduces costs and expedites manufacture. Fused LEDs 20 or fused LED components 10 can be assembled using conventional surface mount or pick-and-place tools and techniques and interconnected with wires 18 made using conventional photolithographic tools and materials.

FIG. 2 illustrates multiple LEDs 30 connected in parallel and to a fuse 40 in a fused LED 20. In contrast, referring to FIG. 4, in some embodiments of the present invention, multiple LEDs 30 are connected in series. In some embodiments, each of the LEDs 30 of the plurality of fused LEDs 20 is a first LED 30 and one or more of the fused LEDs 20 includes a second LED 33 with first and second LED electrical connections 31, 32 for providing power to the second LED 33 to cause the second LED 33 to emit light.

The second LED electrical connection 32 of the first LED 30 is electrically connected to the first LED electrical connection 31 of the second LED 33 so that the first and second LEDs 30, 33 are electrically connected in serial. The arrangement of LEDs 30, 33 in FIG. 4 enables light emitted from fused LED 20 to be perceived to be of a desired color and, in certain embodiments, also enables LEDs with different voltage characteristics to be employed with less power loss.

Figure 5:
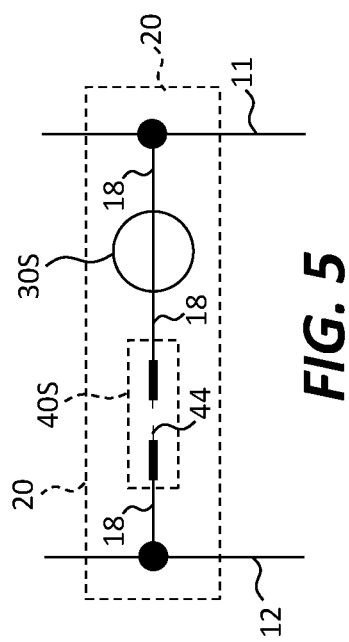
FIG. 5 is a schematic illustrations of a shorted LED and blown fuse in a fused LED component according to an illustrative embodiment of the present invention.

Referring to FIG. 5, certain embodiments of the present invention automatically remove electrically shorted LEDs 30S from an electrical circuit. Without wishing to be bound by any particular theory, since electrical shorts represent a significant fraction of fault LEDs, in-circuit yields can be improved. As shown in FIG. 5, an electrically shorted LED 30S is represented with a wire 18 running through the LED 30. The fuse 40 is blown, that is the fuse is not electrically conductive. Thus, any voltage difference applied to the first and second electrodes 11, 12 will not cause any current to flow through the fused LED 20.

Figure 4:
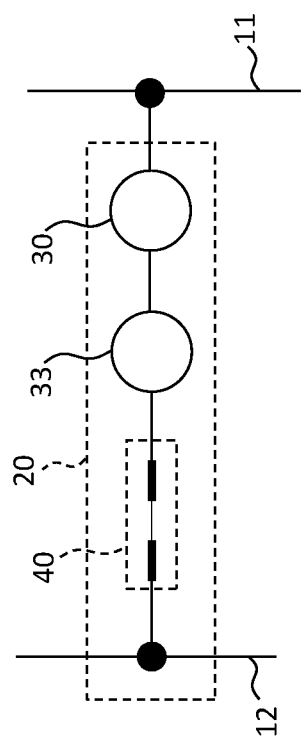
FIG. 4 is a schematic illustration of a fused LED component with multiple serially connected LEDs according to an illustrative embodiment of the present invention.

Various embodiments of the present invention can incorporate various numbers of fused LEDs 20 in a fused LED component 10. For example, a plurality of fused LEDs 20 can include five or more fused LEDs 20, ten or more fused LEDs 20, twenty or more fused LEDs 20, fifty or more fused LEDs 20, or one hundred or more fused LEDs 20. By incorporating greater numbers of fused LEDs 20 in a fused LED component 10, the relative impact of a shorted LED 30S (FIG. 5) and associated blown (i.e., non-conductive) fuse 40S is reduced since the overall output (e.g., lumen) change is relatively small. Similarly, a fused LED 20 can include a plurality of LEDs 30 (as illustrated in FIGS. 2 and 4), for example two, three, five, ten, or twenty LEDs 30.

Figure 6:
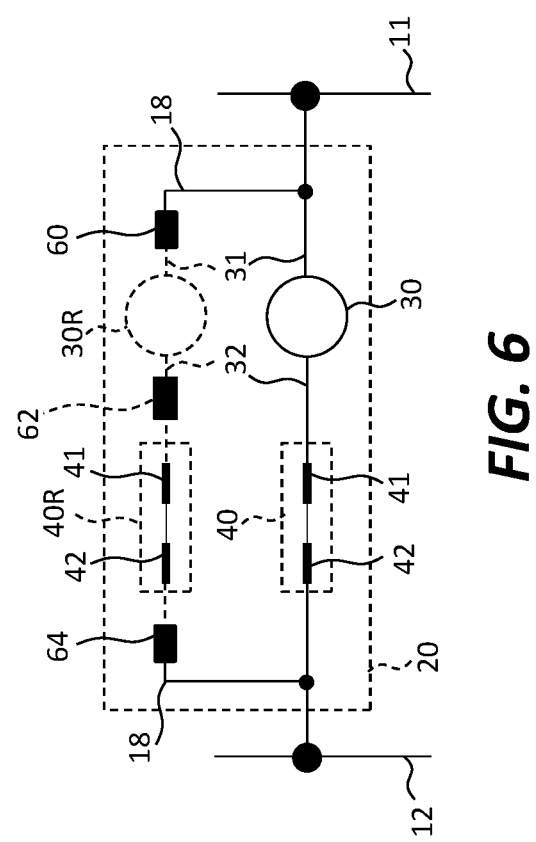
FIG. 6 is a schematic illustration of a fused LED component with a replacement fused LED according to an illustrative embodiment of the present invention.

Referring to FIG. 6, in some embodiments of the present invention, a fuse 40 is a first fuse 40 and each fused LED 20 includes at least one of optional replacement first, second, and third pads 60, 62, 64 and a replacement fuse 40R having replacement fuse first and second fuse electrical connections 41, 42. Optional pads 60, 62, 64 are electrically conductive contact pads that facilitate connection to transfer printed (e.g., micro-transfer printed) LEDs 30 or fuses 40 and can be made using photolithographic tools and materials. In some embodiments, a second fuse electrical connection 42 of a replacement fuse 40R is electrically connected to a second fuse electrical connection 42 of a first fuse 40, to a third replacement pad 64, if present, and a second electrode 12. If present, the replacement first pad 60 is electrically connected to the first electrode 11 and first LED connection 31, for example with wires 18 that can be made with photolithographic methods and materials. A second pad 62 is electrically connected to the first fuse electrical connection 41. The optional first, second, and third pads 60, 62, 64 enable replacement fuses 40R, replacement LEDs 30R, or both, or a replacement fused LED 20 to be micro-transfer printed into the circuitry of a fused LED 20 if an LED 30 is shorted and, correspondingly, its fuse 40 is blown. Thus, a non-functional fused LED component 10 can be repaired and made fully functional.

In some embodiments of the present invention, a replacement fuse 40R is micro-transfer printed into the fused LED 20. In some embodiments, the replacement fuse 40R is made at the same time as a first fuse 40 (e.g., in a common step). In some embodiments, both a replacement fuse 40R and a replacement LED 30R are micro-transfer printed into a fused LED 20 if a LED 30 is shorted and, correspondingly, its fuse 40 is blown. In some embodiments, a replacement fused LED 20 is micro-transfer printed to a fused LED and electrically connected to a first and third pads 60, 64. In some embodiments, different assembly methods can be used to dispose and electrically connect each of a replacement LED 30R, fuse 40R, and fused LED 20 (e.g., surface-mount or pick-and-place methods in combination with or in place of transfer printing). In certain embodiments, a replacement fuse 40R is only operational if a replacement LED 30R is micro-transfer printed or otherwise assembled into a fused LED 20 and electrically connected with a first LED electrical connection 31 of a replacement LED 30R electrically connected to a first pad 60 and a second LED electrical connection of the replacement LED 30R electrically connected to a second pad 62, as otherwise a complete circuit is not formed.

Figure 7:
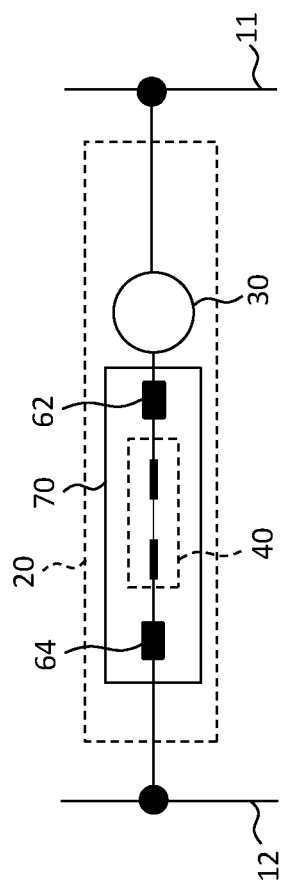
FIG. 7 is a schematic illustration of a fused LED with an electrical fuse jumper according to an illustrative embodiment of the present invention.
Figure 8:
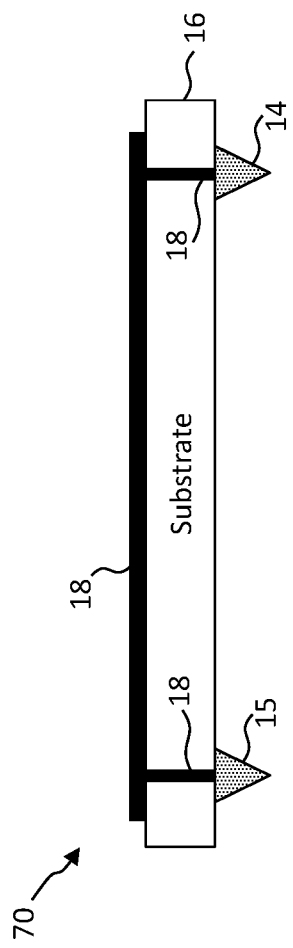
FIG. 8 is a schematic cross section of an electrical fuse jumper according to an illustrative embodiment of the present invention.

In some embodiments of the present invention, with reference to the illustrative embodiments shown in FIGS. 7 and 8, an electrical jumper 70 provides an electrical connection between its first and second connections, (e.g., first connection post 14 and second connection post 15), for example, with a wire 18. An electrical jumper 70 can be micro-transfer printed into a fused LED 20 and electrically connected across the fuse 40 to reduce the resistance of the fuse 40 to save power in the case in which the LED 30 is properly functional. An electrical jumper 70 can also be micro-transfer printed across a replacement fuse 40R, for example, forming an electrical connection between second and third pads 62, 64 and thereby bypassing fuse 40. In some embodiments, when an electrical jumper 70 is electrically connected across a fuse 40 (or replacement fuse 40R), a first connection post 14 is in electrical contact with a second pad 62 and first fuse electrical connection 41 and a second connection post 15 is in electrical contact with a third pad 64 and second fuse electrical connection 42 (and second electrode 12). An electrical jumper 70 can be electrically connected across a fuse 40 or a replacement fuse 40R (e.g., if the fuse 40 is blown) and second and third pads 62, 64 can be provided for both the fuse 40 and the replacement fuse 40R.

Referring to FIG. 9, in some embodiments of the present invention, a light-emission system 90 includes a system substrate 80. An array (e.g., regular array) of fused LED components 10 are disposed on or over the system substrate 80, for example, by micro-transfer printing. Fused LED components 10 can each emit light of a different color (e.g., red fused LED component 10R can emit red light, green fused LED component 10G can emit green light, and blue fused LED component 10B can emit blue light). In some embodiments, fused LED components 10 can emit the same color of light or colors of light that when combined are perceived as white light. Fused LEDs 20 can be disposed on or over a component substrate 16 and component substrates 16 disposed on or over a system substrate 80 (as shown in FIG. 9). In some embodiments, fused LED components 10 are disposed directly on a system substrate 80 (not shown in FIG. 9). At least a portion of a first electrode 11 and a second electrode 12 can be disposed on each component substrate 16, or on a system substrate 80, or both (as shown in FIG. 9). In some embodiments, at least one fuse 40 in a light-emission system 90 is not electrically conductive (i.e., is blown, as illustrated in FIG. 5).

As shown in FIG. 9, a light-emission system 90 can include a plurality of fused LED components 10, e.g., red fused LED component 51 that emits red light, green fused LED component 52 that emits green light, and blue fused LED component 53 that emits blue light. Fused LEDs 20 of each fused LED component 10 can emit light of a common color, different colors, or a color that is perceived to be white. In some embodiments, first electrodes 11 of fused LED components 10 are connected in common (not shown). In some embodiments, a first electrode 11 of each of a plurality of fused LED components 10 are separately controlled (as shown in FIG. 9), for example with a first electrode 11R for controlling a red fused LED component 51 that emits red light, a first electrode 11G for controlling a green fused LED component 52 that emits green light, and a first electrode 11B for controlling a blue fused LED component 53 that emits blue light. In some embodiments, second electrodes 12 of fused LED components 10 are electrically connected in common, for example as a common ground or power signal (as shown in FIG. 9). As will be understood by those knowledgeable in the electronic arts, first and second electrodes 11, 12 can be exchanged and either can serve, for example, as a power or ground connection, depending on the orientation and organization of fused LEDs 20.

Referring to FIG. 10 and again to structures illustrated in FIGS. 5 and 6, a method of making and operating a micro-transfer printable fused LED component 10 having a defective LED 30S includes providing a micro-transfer printable fused LED component 10 wherein at least one of the LEDs 30 is a defective LED 30S having an electrical short in step 100. The fused LED component 10 is tested in step 110 by applying electrical power to the fused LED component 10, for example from a power supply electrically connected across the first and second electrodes 11 and 12. An LED light emission or electrical performance standard is provided in step 170. The performance standard can be any one of a variety of light output or electrical standards, for example a light-emission efficiency in response to current standard, a light-emission color standard, a maximum light output standard, or a maximum current standard. Electrical power can be applied in a forward-biased direction to the LED 30 in the fused LED 20 or in a reverse-biased direction (but at a voltage less than the breakdown voltage of the LED 30). The test results are compared to the LED standard in step 120 and a determination as to whether the test is passed in step 130. If the test is passed, the fused LED component 10 is determined to be a good fused LED component 10. If the test is failed for any of a variety of reasons, including, but not limited to, an electrically shorted LED, the fused LED component 10 is determined to be defective and the fuse 40S is blown in step 140, for example by applying sufficient electrical power across the first and second fuse electrical connections 41, 42 to blow the fuse 40S and render it non-conductive. In certain embodiments, blowing a fuse 40S comprises melting a resistive fuse wire 44 in the fuse 40S with electrical current thereby causing a break in the resistive fuse wire 44 (as shown in FIG. 5). In some embodiments, steps 110, 120, 130, and 140 are performed in a single step by applying reverse-biased current sufficient to blow the fuse 40 to the fused LED 20 if an LED standard is not met. If an LED 30 is shorted, it can conduct reverse-biased current that blows the fuse 40. If an LED 30 is not shorted, it does not conduct reverse-biased current that blows a fuse 40. Alternatively, a forward-biased current can be employed that is greater than an operational current of an LED 30 and has sufficient current to blow a fuse 40 but not damage the LED 30. All of the fused LEDs 20 in one or more of the fused LED components 10 or in a light-emission system 90 can be tested together as described, for example, by providing electrical power to first and second electrodes 11, 12, where the first or second electrodes 11, 12 can be electrically connected in common.

Figure 10:
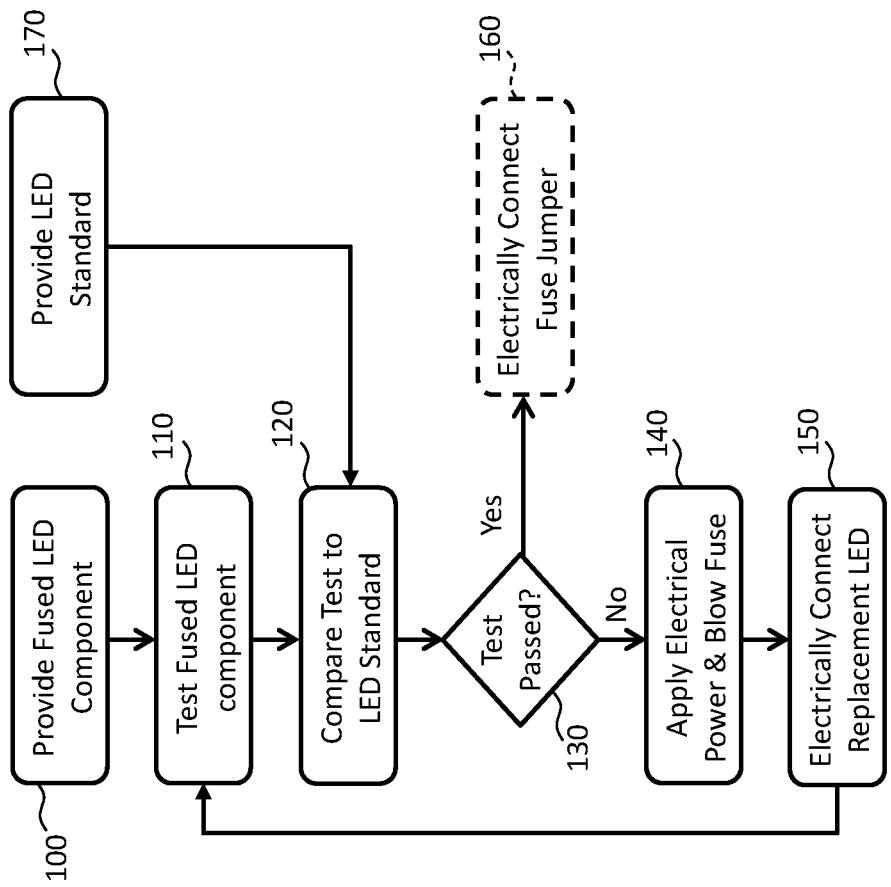
FIG. 10 is a flow diagram illustrating methods of the present invention.

In some embodiments of the present invention, a defective LED 30S of a fused LED 20 is left in a non-functional state (e.g., the method illustrated in FIG. 10 is ended). In some embodiments of the present invention, a replacement LED 30R is provided in step 150 and electrically connected to the first electrode 11 and first fuse electrical connection 41 of a replacement fuse 40R and, optionally, to first and second pads 60, 62 to operate in the place of the non-functional LED 30S. In some embodiments, this is done by micro-transfer printing an LED 30 with first and second connection posts 14, 15, thereby electrically connecting the LED 30 to the first and second pads 60, 62. The first and second pads 60, 62 are electrically connected to the first and second LED electrical connections 31, 32. In some embodiments, this is done by micro-transfer printing a fused LED 20 or LED 30 with first and second connection posts 14, 15 (as illustrated in FIG. 3) electrically connected to first and second pads 60, 62 (if the replacement LED 30R alone is replaced) or the first and third pads 60, 64 (if the replacement LED 30R is part of a replacement fused LED 20). The replacement LED 30R can then be tested as was the original LED 30 by proceeding to test the replacement fused LED 20 in step 110 and continuing the method from that point. A fused LED 20 can include space and electrical connections and pads for multiple replacement fuses 40R and replacement LEDs 30R and the method described can iterate with each of the replacements until an operational fused LED 20 results or the fused LED 20 is finally left in a non-functional state.

Fuses 40 in fused LEDs 20 can have a carefully determined electrical resistance and current capacity fuse wire 44 that uses some operational power in functional fused LED components 10. To reduce the amount of power used and improve operational efficiency of a functioning fused LED component 10, in some embodiments of the present invention, one or more electrical jumper 70 having reduced resistance and optional increased current-carrying capacity in wires 18 compared to the resistance and current-carrying capacity of fuses 40 are provided (for example, as illustrated in FIG. 8) (e.g., after testing one or more LEDs for functionality). The electrical jumper(s) 70 can have first and second connection posts 14, 15 in electrical contact with second and third pads 62, 64, for example by transfer printing (e.g., micro-transfer printing) in optional step 160 to electrically short fuse(s) 40 so that power applied to the fused LED component 10 flows through the electrical jumper(s) 70, in preference to the fuse(s) 40, at a reduced resistance and with improved electrical efficiency. An electrical jumper 70 in electrical contact with a second electrode 12 and a second LED electrical connection 32 of each LED 30 can be provided and electrically connected for each non-defective LED 30 or non-defective replacement LED 30R.

Figure 11:
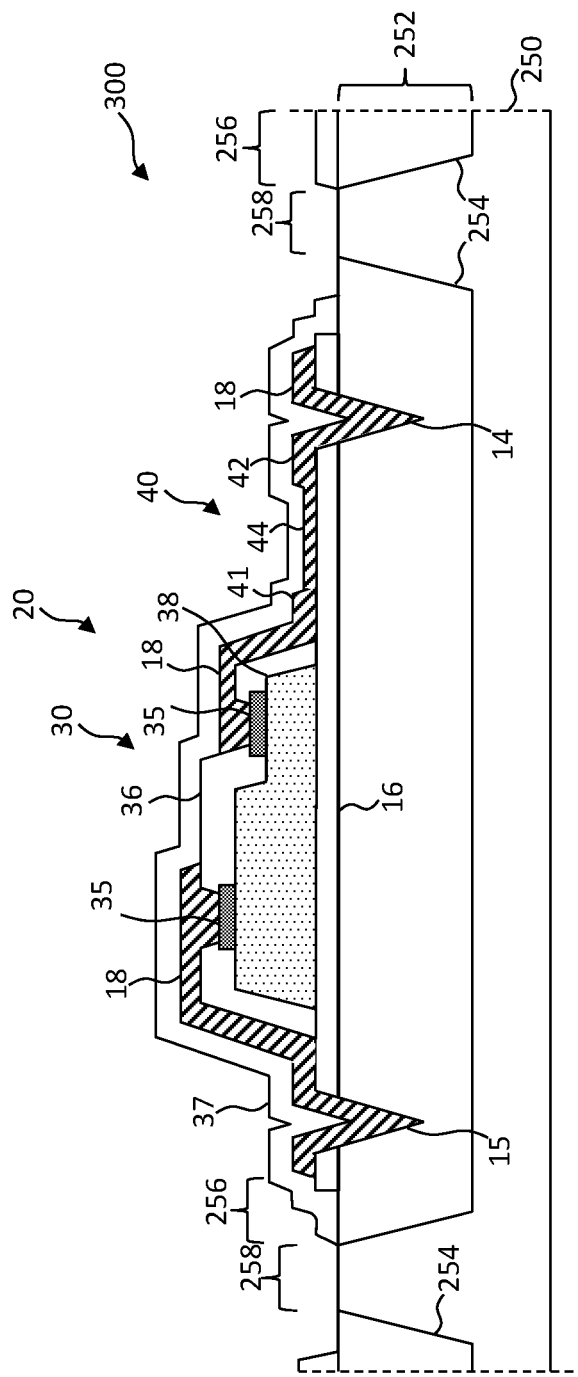
FIG. 11 is a schematic cross section illustrating a fused LED source wafer according to illustrative embodiments of the present invention.

In some embodiments, fused LEDs 20 can be micro-transfer printable fused LEDs 20. A plurality of such fused LEDs 20 can be provided in a micro-transfer printable fused LED source wafer 300, as shown in FIG. 11. Referring to FIG. 11, the fused LED source wafer 300 includes a component wafer 250 including a patterned sacrificial layer 252 having an array of sacrificial portions 254 separated by anchors 258. A fuse 40 and LED 30 of each fused LED 20 is disposed entirely on or over a corresponding sacrificial portion 254. In some embodiments, each fused LED 20 comprises a component substrate 16 on which a fuse 40 and LED 30 are disposed. In some embodiments, multiple fused LEDs 20 are disposed on a common component substrate 16. In some embodiments, separate LED source wafers having micro-transfer printable LEDs 30 or separate fuse source wafers having micro-transfer printable fuses 40 are provided and micro-transfer printed in order to form a fused LED component 10. In some embodiments, LEDs 30 are micro-transfer printed but the fuses are formed photolithographically.

Referring still to FIG. 11, fused LED 20 can include one or more semiconductors 38 or semiconductor layers 38 disposed on a component substrate 16 with LED contacts 35 forming an LED 30. The LED 30 can be insulated with a patterned dielectric layer 36 having vias formed to electrically connect wires 18 to the LED contacts 35 to provide electrical power to the LED 30. Wires 18 can be electrically connected through vias, for example through-silicon vias to first and second connection posts 14, 15. A dielectric layer or encapsulation layer 37 can be disposed over an LED 30 and wires 18 to protect the LED 30 and wires 18 and, optionally, provide a tether 256 physically connected to an anchor 258. When sacrificial portions 254 are etched to form a gap between a fused LED 20 and a component wafer 250, the fused LED 20 can be micro-transfer printed from the fused LED wafer 300 to a system substrate 80 by pressing a transfer device (e.g., stamp) against the fused LED 20 to break (e.g., fracture) the tether 256 to form a broken (e.g., fractured) tether 257 and adhere the fused LED 20 to the transfer device, transferring the transfer device to a system substrate 80, pressing the fused LED 20 to the system substrate 80, and removing the transfer device.

Light-emitting diodes 30 can be inorganic light-emitting diodes made in a semiconductor material, such as a compound semiconductor (e.g., GaN). The semiconductor material can be crystalline. Any one or each of the LEDs 30 or the fuses 40 can have at least one of a width from 2 to 5 μm, 5 to 10 μm, 10 to 20 μm, or 20 to 50 μm, a length from 2 to 5 μm, 5 to 10 μm, 10 to 20 μm, or 20 to 50 μm, and a height from 2 to 5 μm, 4 to 10 μm, 10 to 20 μm, or 20 to 50 μm.

First or second electrodes 11, 12, first and second fuse electrical connections, and first and second LED electrical connections can be electrically conductive metal wires formed, or disposed on, a component substrate 16 or a system substrate 80 on which fused LEDs 20 are micro-transfer printed and can be made using, for example, photolithographic methods, tools, and materials.

A fuse 40 is an electrically conductive element that becomes permanently non-conductive when a pre-determined current passes through the fuse and is a type of sacrificial low-resistance resistor providing overcurrent protection. The essential component of a fuse 40 is a low-resistance electrical conductor (e.g., fuse wire 44) that melts, oxidizes, vaporizes, sublimates, reacts, or otherwise loses conductivity when current exceeding a pre-determined threshold flows through the fuse 40, referred to herein as melting, although fuses 40 of the present invention are not limited to fuses 40 that melt. A fuse 40 can have a melting temperature that is greater than the maximum rated operating temperature of an LED 30. According to some embodiments of the present invention, a fuse 40 includes a metal fuse wire 44 or strip. As used herein, a fuse 40 that is rendered non-conductive is a blown fuse 40S and the process of rendering the fuse 40 non-conductive is the process of blowing the fuse 40. The current at which a fuse 40 is blown is its rated current or current rating. In some embodiments, the rated current is greater than or equal to 2 times, 5 times, 10 times, 20 times, 50 times, 100 times, 500 times, or 1000 times the maximum desired LED 30 current.

A fuse wire 44 in an electrical fuse 40 can be a metal wire formed in a pre-determined shape and size, such as a shape and size providing a cross section designed to melt when conducting a desired current. A fuse 40 or fuse wire 44 can be made, for example, of a metal such as zinc, copper, silver, aluminum, nickel, chrome, or tin, or metal alloys that include these or other metals, such as nickel-chromium. In some embodiments, a fuse 40 or fuse wire 44 can be made of a degenerate semiconductor that is highly doped and conducts current in a manner similar to a native metal. Fuses 40 or fuse wires 44 can be made of or in a semiconductor and can be polysilicon. In some embodiments, a fuse wire 44 has a different cross section but is made of the same materials as at least one of first and second fuse electrical connections 41, 42, first or second electrodes 11, 12, and first and second LED electrical connections 31, 32. A fuse 40 or fuse wire 44 can have a cross section that is small or smaller than the cross section of other electrical conductors with which the fuse wire 44 is electrically connected in series, such as wires 18, first or second electrodes 11, 12, first or second LED electrical connections 31, 32, or first or second fuse electrical connections 41, 42. A fuse wire 44 can be a joint between two other electrical conductors. If an LED 30 is too conductive (i.e., shorted), for example if the LED 30 has an electrical short or short circuit (e.g., whether or not the LED 30 emits any light, too much light, too little light, or no light), a fuse 40 can cease to conduct any current at all when an excess of current is supplied to the shorted LED 30 in an amount sufficient to blow the fuse 40. The term 'shorted' or 'short' refers to an electrical short circuit in a component, in this case an LED 30 in a fused LED component 10. A fused LED component 10 having at least one shorted LED 30 is referred to as a shorted fused LED component 10.

Furthermore, each of the different fused LEDs 20 in a fused LED component 10 can have a different optimal or maximum desired current. Fuses 40 can be customized to a particular LED 30 or LED technology with which they are electrically in series. Likewise, fused LEDs 20 in one fused LED component 10 can be different from fused LEDs 20 in another fused LED component 10, for example in a light-emission system 90. The LEDs 30 can be different, for example, due to emitting different colors of light or having different fuses (e.g., blowing responsive to different amounts of electrical current, voltage, or power).

Figure 13:
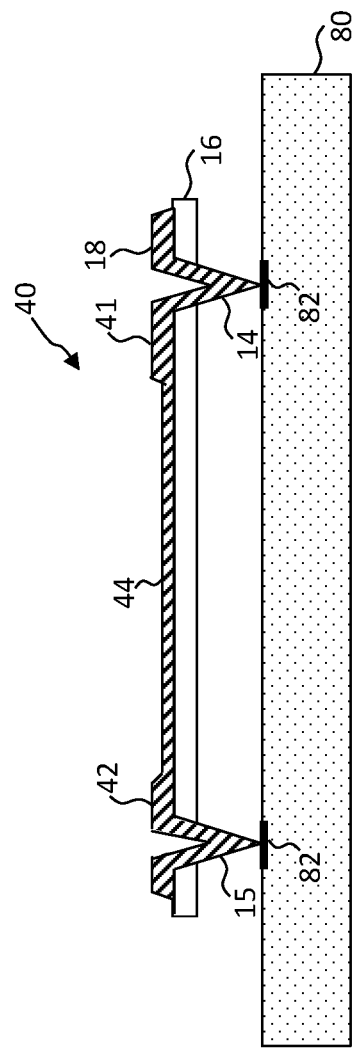
FIG. 13 is a schematic cross section illustrating a micro-transfer printed fuse according to illustrative embodiments of the present invention.
Figure 15:
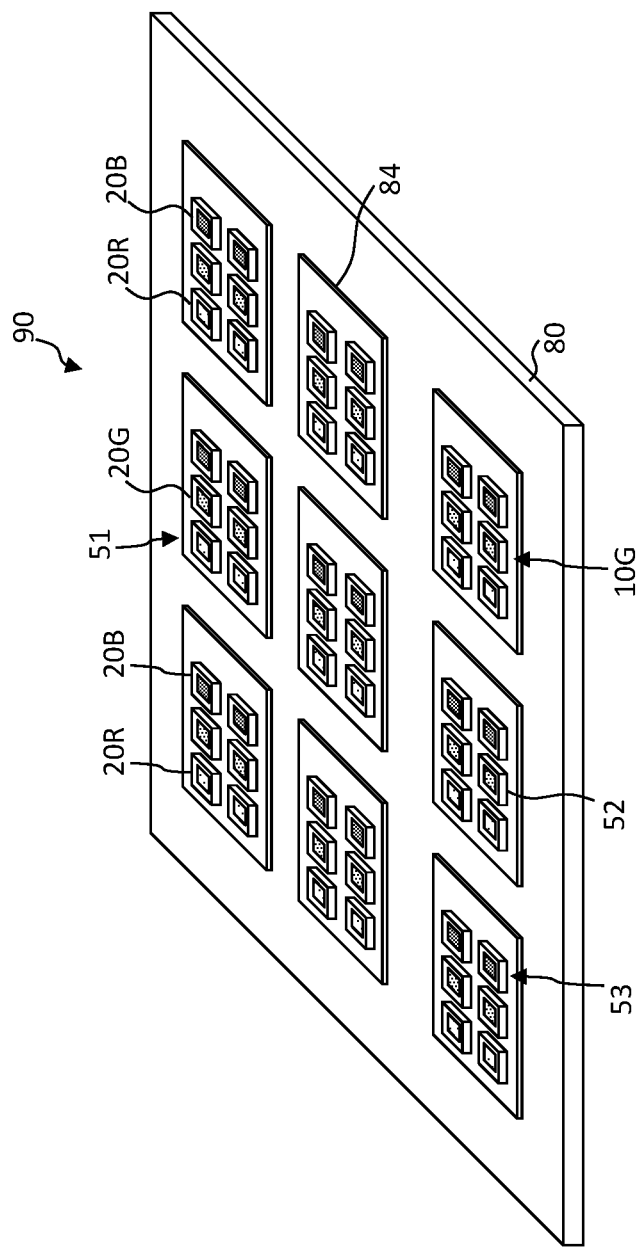
FIG. 15 is a perspective illustrating a light-emission system according to illustrative embodiments of the present invention.

In some embodiments of the present invention, fused LEDs 20 are disposed directly on a system substrate 80, for example by micro-transfer printing fused LEDs 20 from a fused LED source wafer 300, as shown in FIG. 12. In some embodiments, LEDs 30 or fuses 40 (for example, as shown in FIG. 13), or both, are each directly micro-transfer printed to a system substrate 80. In some embodiments, fused LEDs 20 (e.g., red fused LEDs 20R that emit red light, green fused LEDs 20G that emit green light, blue fused LEDs 20B that emit blue light), or fused LED components 10 (for example, as illustrated in FIGS. 14, 15) are transferred as a module with a module substrate 84 to a system substrate 80, using micro-transfer printing, surface-mount techniques, or pick-and-place methods. The use of fused LEDs 20 or fused LED components 10 that are transferred to a system substrate 80 as a unit can simplify manufacturing processes, enhance testing, and improve yields. Fuses 40 and LEDs 30 can be electrically connected on a fused LED source wafer 300 using photolithographic methods and materials. Likewise, at least one of fuses 40 and LEDs 30, fused LEDs 20, and fused LED components 10 can be electrically connected on a module substrate 84 or system substrate 80 using photo-lithographic methods and materials. At least one of fuses 40, LEDs 30, fused LEDs 20, and fused LED components 10 can be adhered to a system substrate 80 and electrically connected to contact pads 82 on a module substrate 84 or system substrate 80 to electrically connect the elements in a larger system, for example in lighting systems as illumination devices, in light sources, in front lights or backlights, in display systems, or in systems using optoelectronic elements, for example indicators. Electrical connections between fused LEDs 20 or fused LED components 10 on component substrates 16, module substrates 84, or system substrates 80 can be made using connection posts, as described, using photolithographic techniques, or using wire-bond methods.

In the illustrative embodiment shown in FIG. 15, the second fused LED 20 of each pair of fused LEDs 20 that emit the same color of light can be a replacement fused LED 20 or incorporate replacement LEDs 30R.

In some methods in accordance with embodiments of the present invention, a fused LED source wafer 300 having fused LEDs 20 with a plurality of connection posts 14, 15 is made by providing a component wafer 250. A sacrificial layer 252 is patterned in, on, or over the component wafer 250 to form sacrificial portions 254 separated by portions of the component wafer 250 forming anchors 258 using photolithographic materials and methods. The component wafer 250 can be a substrate such as a semiconductor, glass, polymer, metal, or ceramic wafer. Connection post forms are etched into the sacrificial portions 254 and an LED 30 is provided by forming or disposing an LED 30 entirely on or over the sacrificial portion 254, for example, by micro-transfer printing the LED 30 from an LED source wafer over or onto the sacrificial portion 254. The LED 30 has first and second LED electrical connections 31, 32 for providing power to the LED 30 to cause the LED 30 to emit light. In some embodiments, an LED 30 is formed on a sacrificial portion 254.

In some embodiments, a patterned dielectric layer 36 is formed or otherwise disposed on an LED 30 to protect the LED 30 and a path or via for contacting electrical LED contacts 35 is provided. Electrical conductors, such as wires 18, are formed in electrical contact with the electrical LED contacts 35 over a sacrificial portion 254 and a connection post form to make first and second connection posts 14, 15 and first and second LED electrical connection 31, 32. The patterned dielectric layer 36 can be, for example, silicon dioxide and the electrical conducting wires 18 can be metal deposited and patterned using photolithographic materials, tools, and methods such as coating, sputtering, or evaporation, or etching with patterned photoresist.

In some embodiments, a fuse 40 having first and second fuse electrical contacts 41, 42 is disposed entirely in, on, or over a sacrificial portion 254. In some embodiments, fuses 40 are formed on the sacrificial portions 254 of a component wafer 250 using photolithographic processes and materials and can be made, partially or entirely, in a common step with at least one of wires 18, first and second fuse electrical connections 41, 42, and first and second LED electrical connections 31, 32, using the same materials or including at least some of the same materials as those of the aforementioned electrical connections and wires. Similarly, the first and second electrodes 11, 12 or portions of the first and second electrodes 11, 12 can be formed in a common step with the wires 18, first and second fuse electrical connections 41, 42, or first and second LED electrical connections 31, 32 and using the same materials or including at least some of the same materials. In some embodiments, a fuse 40 is provided by micro-transfer printing the fuse 40 from a fuse source wafer. If either or both the LED 30 and fuse 40 are micro-transfer printed, they can have connection posts to enable electrical connections in, on, or over the component substrate 16, module substrate 84, or system substrate 80. A fuse wire 44 can be made with a desired cross section together with at least one of a portion of the first and second fuse electrical contacts 41, 42, portion of the first and second LED electrical connections 31, 32, portions of the first and second electrodes 11, 12, and first and second connection posts 14, 15. In a following step, additional material can be provided to at least one of the first and second fuse electrical contacts 41, 42, portion of the first and second LED electrical connections 31, 32, portions of the first and second electrodes 11, 12, and first and second connection posts 14, 15 to increase their cross section and electrical conductivity compared to the fuse wire 44. These elements can form at least portions of the fuses 40, the fused LEDs 20, or the fused LED components 10. An optional encapsulation layer 37 is provided over the LED 30, wires 18, and fuse 40.

A sacrificial portion 254 can be etched to form tethers 256 connecting fused LED 20 to anchors 258 and a gap between the fused LED 20 and the component wafer 250, enabling the fused LEDs 20 to be micro-transfer printed with a transfer stamp. The sacrificial portions 254 can be, for example, an oxide layer or a designated anisotropically etchable portion of the component wafer 250 or, once etched, the gap between the fused LED 20 and the component wafer 250. In some embodiments, an optional encapsulation layer 37 is patterned (as shown in FIG. 11) and can include an oxide or nitride such as silicon nitride and can form at least a portion of a tether 256.

A fused LED source wafer 300 can include a plurality of sacrificial portions 254 and corresponding plurality of fused LEDs 20 disposed on the sacrificial portions 254, each fused LED 20 having one or more LEDs 30, one or more fuses 40 electrically connected in series with one or more corresponding LEDs 30, and optionally first and second connection posts 14, 15 for making electrical connections to the fused LEDs 20.

An encapsulation layer 37 and wires 18 can provide sufficient mechanical and structural rigidity to a fused LED 20 such that the fused LED 20 can be micro-transfer printed without additional support. In some embodiments, a sacrificial layer 252 provides a surface with sufficient mechanical rigidity to enable LEDs 30, fuses 40, or fused LEDs 20 to be micro-transfer printed and first and second electrodes 11, 12 and wires 18 to be formed using photolithographic processes. A component substrate 16, for example an oxide or nitride layer such as a silicon dioxide layer can be formed on or over sacrificial portions 254, for example using photolithographic processes, tools, and materials.

Shorted fused LEDs 20 can be determined by measuring the light output of each fused LED 20 (e.g., as in step 110) and comparing it to an expected light output (e.g., as in step 120). Shorted fused LEDs 20 typically do not emit light and they can be distinguished from open fused LEDs 20 (fused LEDs 20 that do not conduct current and do not emit light) by controlling the fused LEDs 20. Shorted fused LEDs 20 with shorted LEDs 30S can also be determined by measuring (e.g., as in step 110) the current through each LED 30 individually and comparing the measured current to an expected standard (e.g., as in step 120). Shorted fused LEDs 20 can conduct more current than functional fused LEDs 20, for example, when provided with a voltage difference that is less than the expected voltage drop for the LED 30 when provided with a reverse-biased voltage differential, or by noting a greater-than-expected current when driven with a predetermined operating voltage. In some embodiments, a shorted fused LED 20 is determined by passing a current through the shorted fused LEDs 20 and measuring the voltage across the fused LEDs 20. An electrical short can be measured as a very low voltage drop in comparison with a good fused LED 20, which can have a voltage drop exceeding, for example, two volts. For example, an electrical short can be measured as a voltage drop across the power supply lines (power and ground lines, e.g., first and second electrodes 11, 12) of a shorted fused LED 20 of less than two volts, less than 1.5 volts, less than 1.0 volts, less than 0.5 volts, or less than 0.25 volts.

Fuses 40 of a shorted fused LEDs 20 can be blown by providing a reverse-biased current across the shorted fused LEDs 20 with a voltage that is greater than the normal operating voltage but less than the breakdown voltage of the LEDs 30, to avoid destroying functional fused LED 20. In some embodiments, a shorted fused LED 20 can conduct enough current to drive the plurality of functional fused LEDs 20 in a fused LED component 10. By setting a fuse 40 current rating at a current level greater than the current necessary to operate a single functional LED 30 but less than the current necessary to operate multiple LEDs 30 in a fused LED component 10, a fuse 40 of a shorted fused LED 20 can be blown by controlling fused LEDs 20 to emit light from all of the other fused LEDs 20 in a fused LED component 10.

Fuses 40 of shorted fused LEDs 20 in a fused LED component 10 can be blown in different ways. In one way, each fuse 40 of the shorted in a fused LEDs 20 is sequentially blown. In another way, all of the fuses 40 of the shorted fused LEDs 20 in a fused LED component 10 are blown at the same time. For example, by providing all of the fused LEDs 20 in fused LED component 10 or light-emission system 90 with a reverse-biased voltage and enough current to blow the fuses 40 (but less than an LED 30 breakdown voltage), all of the fuses 40 can be blown one after the other or all at once. In another example, by operating all of fused LEDs 20 in a fused LED component 10 at the same time, a forward-biased low-resistance shorted fused LEDs 20 will conduct more current than the normally functional fused LEDs 20 in a fused LED component 10 and will blow one or more fuses 40 of the shorted fused LEDs 20.

The current rating of a fuse 40 can depend, at least in part, on the temperature of the fuse 40. Since an operational LED 30 can have an elevated temperature, the associated fuse 40 can also have an elevated temperature that affects its current rating. Hence, the spatial location of a fuse 40 with respect to its corresponding LED 30 can be selected to reduce changes in the fuse 40 current rating due to temperature changes in the LED 30 (e.g., since greater spatial separation can reduce the influence of LED 30 temperature on fuse 40 temperature). A fuse 40 can be taken to be located a distance D from its associated LED 30. The associated LED 30 can be taken to have a length L and width W over a system substrate 80. In some embodiments, the distance D is greater than or equal to at least one of the length L and width W. In some embodiments, the distance D is greater than or equal to 1.5 times, 2 times, 3 times, 4 times, 5 times, 10 times, or 20 times at least one of the length L and width W. Without wishing to be bound by any particular theory, a distance D being greater than or equal to at least one of a length L and width W can reduce the influence of LED temperature on the fuse current rating. The rated current of the fuse 40 can be set to compensate for the operating temperature of, for example, the LED 30, fused LEDs 20, or fused LED component 10.

As will be apparent to those skilled in the art of substrate and component layout, alternative arrangements of the fused LEDs 20 and fused LED components 10 are possible.

In some embodiments of the present invention, LEDs 30, fuses 40, or fused LEDs 20 (collectively referred to below as elements) have a thin substrate with a thickness of only a few microns, for example less than or equal to 25 microns, less than or equal to 15 microns, or less than or equal to 10 microns, and/or at least one of a width and length of 5-10 microns, 10-50 microns, 50-100 microns, or 100-1000 microns. Such micro-transfer printable elements can be made in a semiconductor source wafer (e.g., a silicon or GaN wafer) having a process side and a back side used to handle and transport the wafer. The elements can be formed using lithographic processes in an active layer on or in the process side of a source wafer. An empty release layer space (corresponding to sacrificial portion 254 in FIG. 11 can be formed beneath the micro-transfer printable elements with tethers 256 connecting the micro-transfer printable elements to the source wafer (e.g., component wafer 250, LED source wafer, or fuse source wafer) in such a way that pressure applied against the micro-transfer printable elements with a transfer device (e.g., stamp) breaks (e.g., fractures) the tethers 256 to form a broken (e.g., fractured) tether 257 to release the micro-transfer printable elements from the source wafer. The elements are then micro-transfer printed to a component substrate 16, module substrate 84, or system substrate 80. Lithographic processes in the integrated circuit art for forming micro-transfer printable elements in a source wafer, for example transistors, LEDs, wires, and capacitors, can be used. The same etching and transfer process can be used to micro-transfer print the assembled or constructed elements onto the component substrate 16, module substrate 84, or system substrate 80.

Methods of forming such micro-transfer printable structures are described, for example, in the paper *AMOLED Displays using Transfer-Printed Integrated Circuits* and U.S. Pat. No. 8,889,485, referenced above. For a discussion of micro-transfer printing techniques, see U.S. Pat. Nos. 8,722,458, 7,622,367 and 8,506,867, the disclosure of each of which is hereby incorporated by reference herein in its entirety. Micro-transfer printing using compound micro-assembly structures and methods can also be used with the present invention, for example, as described in U.S. patent application Ser. No. 14/822,868, filed Aug. 10, 2015, entitled *Compound Micro-Assembly Strategies and Devices*, the disclosure of which is hereby incorporated by reference in its entirety. In some embodiments, a fused LED 20 of fused LED component 10 is a compound micro-assembled device.

According to various embodiments of the present invention, a component wafer 250 can be provided with at least one of LEDs 30, fuses 40, release layer (sacrificial layer 252), tethers 256, and first and second connection posts 14, 15 already formed, or any of these can be constructed as part of a method in accordance with some embodiments of the present invention. Similarly, any source wafers having micro-transfer printable LEDs 30, fuses 40, or fused LEDs 20 thereon can be constructed or transfer printed as part of a method in accordance with some embodiments of the present invention.

First and second connection posts 14, 15 are electrical connections formed on a side of a micro-transfer printable element such as the LED 30, fuse 40, or fused LEDs 20 that extend generally perpendicular to a surface of the element. Such connection posts can be formed from metals such as aluminum, titanium, tungsten, copper, silver, gold, or other conductive metals. In some embodiments, the connection posts are made of one or more high elastic modulus metals, such as tungsten. As used herein, a high elastic modulus is an elastic modulus sufficient to maintain the function and structure of a connection post when pressed into a system substrate electrical contact pad 82.

First and second connection posts 14, 15 can be formed by repeated masking and deposition processes that build up three-dimensional structures, for example, by etching one or more layers of metal evaporated or sputtered on the process side of the element. Such structures can also be made by forming a layer above the element surface (e.g., sacrificial layer 252), etching a well into the surface to form a connection post form, filling or covering it with a patterned conductive material such as metal, and then removing the layer. The first or second connection posts 14, 15 can have a variety of aspect ratios and typically have a peak area smaller than a base area and can have a sharp point for embedding in or piercing electrical contact pads 82. Connection posts can include a post material coated with an electrically conductive material different from the post material. A post material can be, for example, an electrically conductive metal or a doped or undoped semiconductor or an electrically insulating polymer, for example a resin, cured, resin, or epoxy and can have any of a variety of hardness or elastic modulus values. In some embodiments, a post material is softer than the conductive material so that the conductive material can crumple when the connection post is under mechanical pressure. Alternatively, the conductive material is softer than the post material so that it deforms before the post material when under mechanical pressure. By deform is meant that the first or second connection posts 14, 15, the contact pads 82, or the conductive material change shape as a consequence of a transfer printing that physically contacts the first and second connection posts 14, 15 to contact pads 82. Connection posts or post material can be a semiconductor material, such as silicon or GaN, formed by etching material from around the connection post. Coatings, such as the conductive material can be evaporated or sputtered over the post material structure and then pattern-wise etched to form a connection post. The conductive material can be a solder or other metal or metal alloy that flows under a relatively low temperature, for example less than 120 degrees C. In particular, the conductive material can have a melting point less than the melting point of the post material.

In certain embodiments, two or more adjacent connection posts comprise connection posts of different heights. In certain embodiments, the distance between two or more connection posts is less than at least one of a width and length of a contact pad 82 in a direction parallel to the component substrate 16. In certain embodiments, connection posts are disposed in groups, wherein the connection posts within a group are electrically connected to a common contact pad and the connection posts in different groups are electrically connected to different contact pads 82. In certain embodiments, the connection posts are disposed in groups and a spacing between adjacent connection posts within a given group is less than a spacing between adjacent groups. In certain embodiments, the connection posts within a group are electrically shorted together. In certain embodiments, each of two or more connection posts is a multi-layer connection post. In certain embodiments, contact pads 82 comprise a material that is the same material as a material included in the connection post.

In certain embodiments, contact pads 82 comprise a material that is softer than that of the connection posts. In certain embodiments, connection posts comprise a material that is softer than that of the contact pads 82. In certain embodiments, a conductive material other than a material of a contact pad 82 or a connection post adheres or electrically connects, or both, the contact pad 82 to the connection post. In certain embodiments, at least a portion of a contact pad 82 has a first conductive layer and a second conductive layer over the first conductive layer, and the second conductive layer has a lower melting temperature than the first conductive layer. In some embodiments, a contact pad 82 is coated with a non-conductive layer or the contact pad 82 is formed on a compliant non-conductive layer. In certain embodiments, a second conductive layer is a solder. In certain embodiments, a contact pad 82 is welded to a connection post. In certain embodiments, contact pads 82 are non-planar and the connection posts are inserted into the contact pads 82.

System substrate contact pads 82 can be made of or include a relatively soft metal, such as tin, solder, or tin-based solder, to assist in forming good electrical contact with connection posts and adhesion with the elements. As used herein, a soft metal may refer to a metal into which a connection post can be pressed to form an electrical connection between the connection post and the contact pad 82. In some embodiments, a contact pad 82 can plastically deform and flow under mechanical pressure to provide a good electrical connection between the connection post and the contact pad 82.

In some embodiments of the present invention, connection posts can include a soft metal and the contact pads 82 include a high elastic modulus metal. In some embodiments, the connection posts can plastically deform and flow under mechanical pressure to provide a good electrical connection between the connection post and the contact pads 82.

A layer of adhesive can be optionally disposed on or formed on a system substrate 80. If an optional layer of adhesive is disposed or formed on a system substrate 80, first and second connection posts 14, 15 can be driven through the adhesive layer to form an electrical connection with the contact pads 82 beneath the adhesive layer. The adhesive layer can be cured to more firmly adhere the element and maintain a robust electrical connection between the first and second connection posts 14, 15 and contact pads 82 in the presence of mechanical stress. The adhesive layer can undergo some shrinkage during the curing process that can further strengthen the electrical connectivity and adhesion between the connection post and the contact pads 82.

In some embodiments of the present invention, connection posts are in contact with, are embedded in, or pierce contact pads 82 of an element. In some embodiments, either or both of one or more connection posts (e.g., connection posts 14, 15) and contact pads 82 are deformed or crumpled into a non-planar shape or are deformed so that the surfaces of the connection posts and the contact pads 82 change shape on contact with each other. The deformation or crumpling can improve the electrical connection between the connection posts and the contact pads 82 by increasing the surface area that is in contact between the connection posts and the contact pads 82. To facilitate deformation, in some embodiments, connection posts have a composition softer than that of contact pads 82 or contact pads 82 have a composition softer than the connection posts.

In some embodiments, contact pads 82 are coated with an optional polymer layer that can be patterned. Connection posts can then be driven through the polymer layer to make electrical contact with the contact pads 82. The polymer layer can protect the contact pads 82 and serves to embed the connection posts in the contact pads 82 by adhering to the connection posts. Alternatively, a compliant polymer layer is formed beneath the contact pads 82 to facilitate the mechanical contact made when the connection posts are embedded in the contact pads 82. For example, a metal or metal alloy containing gold, tin, silver, or aluminum, can be formed over a polymer layer or a polymer layer coated over a metal or metal alloy containing gold, tin, silver, or aluminum. A compliant polymer layer can also serve to adhere at least one of first connection post 14 and second connection post 15 to contact pads 82.

In some embodiments, fused LEDs 20 include LEDs 30 or assemblies of such LEDs 30 formed in or disposed on a semiconductor wafer, for example gallium arsenide or silicon, which can have a crystalline structure. Processing technologies for these materials typically employ high heat and reactive chemicals. However, by employing transfer technologies that do not stress the fused LEDs 20 or substrate materials, more benign environmental conditions can be used, for example, as compared to thin-film manufacturing processes. Thus, certain embodiments of the present invention have an advantage in that flexible substrates, such as polymeric substrates, that are intolerant of extreme processing conditions (e.g. heat, chemical, or mechanical processes) can be employed for a system substrate 80 or fused LEDs 20. Furthermore, it has been demonstrated that crystalline semiconductor substrates have strong mechanical properties and, in small sizes, can be relatively flexible and tolerant of mechanical stress. This is particularly true for certain substrates having 5-micron, 10-micron, 20-micron, 50-micron, or even 100-micron thicknesses. Micro-transfer printable fused LEDs 20 can be formed in a microcrystalline, polycrystalline, or amorphous semiconductor layer.

The micro-transfer printable elements in accordance with some embodiments of the present invention can be constructed using foundry fabrication processes used in the art. Layers of materials can be used, including materials such as metals, oxides, nitrides and other materials used in the integrated-circuit arts. Each element can be or include a complete semiconductor integrated circuit and can include, for example, transistors. Elements can have different sizes, for example, 1000 square microns or 10,000 square microns, 100,000 square microns, or 1 square mm, or larger, and can have variable aspect ratios, for example 1:1, 2:1, 5:1, or 10:1. Elements can be rectangular or can have other shapes.

Certain embodiments of the present invention provide advantages over other printing methods described in the prior art. By employing connection posts and a printing method that results in micro-transfer printed elements disposed on and/or over a system substrate 80 with first and second connection posts 14, 15 adjacent to the system substrate 80, low-cost methods for printing elements in large quantities over a system substrate 80 is provided. Furthermore, additional process steps for electrically connecting the micro-transfer printable elements to the system substrate 80 can be obviated.

An element source wafer and micro-transfer printable elements, micro-transfer printing stamps, and system substrates 80 can be made separately and at different times or in different temporal orders or locations and provided in various process states.

Certain methods of the present invention can be iteratively applied to a single or multiple system substrates 80. By repeatedly transferring sub-arrays of micro-transfer printable elements from a transfer stamp to a system substrate 80 and relatively moving the transfer stamp and system substrates 80 between stamping operations by a distance equal to a size of the sub-array of selected micro-transfer printable elements between each transfer of micro-transfer printable elements, an array of micro-transfer printable elements formed at a high density on a source wafer (e.g., a fused LED source wafer 300) can be transferred to a system substrate 80 at a much lower density. In practice, a source wafer is likely to be expensive, and forming micro-transfer printable elements with a high density on the source wafer will reduce the cost of the micro-transfer printable elements (e.g., by reducing the amount of unused source wafer material per micro-transfer printable element), especially as compared to forming the same micro-transfer printable elements directly on a system substrate 80.

In the case where active micro-transfer printable elements are or include an integrated circuit formed in a crystalline semiconductor substrate material, an integrated circuit substrate provides sufficient cohesion, strength, and flexibility that it can be transfer printed to a system substrate 80 adhere to the system substrate 80 without breaking as the transfer stamp is removed.

In comparison to thin-film manufacturing methods, using densely populated source substrate wafers and transferring printable elements to a system substrate 80 that requires only a sparse array of elements located thereon does not waste or require active layer material on a system substrate 80. Certain embodiments of the present invention can also be used in transferring micro-transfer printable elements made with crystalline semiconductor materials that have higher performance than thin-film active components. Furthermore, the flatness, smoothness, chemical stability, and heat stability requirements for a system substrate 80 used in certain embodiments of the present invention may be reduced because the adhesion and transfer process is not substantially limited by the material properties of the system substrate 80. Manufacturing and material costs may be reduced because of high utilization rates of more expensive materials (e.g., the source substrate) and reduced material and processing requirements for the system substrate 80.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 fused LED component
11 first electrode
11R red first electrode
11G green first electrode
11B blue first electrode
12 second electrode
14 first connection post
15 second connection post
16 component substrate
18 wire
20 fused LED
20R red fused LED
20G green fused LED
20B blue fused LED
30 LED/first LED
30R replacement LED
30S electrically shorted LED/defective LED
31 first LED electrical connection
32 second LED electrical connection
33 second LED
34 third LED
35 LED contacts
36 patterned dielectric layer
37 patterned dielectric layer/encapsulation layer
38 semiconductor/semiconductor layers
40 fuse
40R replacement fuse
40S blown fuse
41 first fuse electrical connection
42 second fuse electrical connection
44 fuse wire
51 red fused LED component
52 green fused LED component
53 blue fused LED component
60 first pad
62 second pad
64 third pad
70 electrical jumper
80 system substrate
82 contact pad
84 module substrate
90 light-emission system
100 provide fused LED component step
110 test fused LED component step
120 compare test to LED standard step
130 test passed step
140 apply electrical power and blow fuses step
150 electrically connect replacement LED step
160 electrically connect fuse jumper step
170 provide LED standard step
250 component wafer
252 sacrificial layer
254 sacrificial portion
256 tether
257 broken tether
258 anchor/anchor portion
300 fused LED source wafer

What is claimed:

1. A fused light-emitting diode (LED) component, comprising:

a first electrode and a second electrode; and
a plurality of fused LEDs, each fused LED comprising:
an LED comprising a first LED electrical connection and a second LED electrical connection for providing power to the LED to cause the LED to emit light, wherein the first LED electrical connection is electrically connected to the first electrode, and
a fuse comprising a first fuse electrical connection and a second fuse electrical connection, the first fuse electrical connection electrically connected to the second LED electrical connection and the second fuse electrical connection electrically connected to the second electrode,
wherein the plurality of fused LEDs are electrically connected in parallel,
wherein the LED of each of the plurality of fused LEDs is a first LED and one or more of the plurality of fused LEDs each comprises a second LED comprising a first LED electrical connection and a second LED electrical connection for providing power to the second LED to cause the second LED to emit light, and
wherein, for each fused LED of the one or more of the plurality of fused LEDs, tithe first LED electrical connection of the first LED is electrically connected in common with the first electrical connection of the second LED, (ii) [[and ]]the second LED electrical connection of the first LED is electrically connected in common with the second LED electrical connection of the second LED so that the first LED and the second LED of the fused LED are electrically connected in parallel, and (iii) all of the current that passes through the first LED and all of the current that passes through the second LED passes through the fuse of the fused LED.

2. The fused LED component of claim 1, wherein the LEDs all emit substantially the same color of light.

3. The fused LED component of claim 1, wherein a combination of the LEDs together emit light that is perceived by a human visual system as white light.

4. The fused LED component of claim 1, wherein at least one of the one or more of the fused LEDs comprises a third LED comprising a first LED electrical connection and a second LED electrical connection for providing power to the third LED to cause the third LED to emit light,
wherein, for each of the at least one of the one or more of the plurality of fused LEDs, the first LED electrical connection of the first LED is electrically connected in common with the first electrical connection of the third LED and the second LED electrical connection of the first LED is electrically connected in common with the second LED electrical connection of the third LED so that the first, second, and third LEDs are electrically connected in parallel.

5. The fused LED component of claim 1, wherein the first electrode and the second electrode are disposed at least partially on a system substrate, and the fused LED component comprises one or more component substrates different from the system substrate on which one or more of the plurality of fused LEDs and at least a portion of the first electrode and at least a portion of the second electrode are disposed.

6. The fused LED component of claim 5, wherein at least one of the one or more component substrates comprises a first connection post and a second connection post and at least one of (i) the first connection post is electrically connected to the first electrode, (ii) the second connection post is electrically connected to the second electrode, and (iii) the first connection post and the second connection post each have a peak area smaller than a base area.

7. The fused LED component of claim 1, wherein one or more of the plurality of fused LEDs comprises an electrical jumper comprising a first connection post and a second connection post each having a peak area less than a base area that electrically connects the first fuse electrical connection and the second fuse electrical connections.

8. The fused LED component of claim 5, comprising a component substrate on which the plurality of fused LEDs and at least a portion of the first and second electrodes are disposed.

9. A method of making a fused LED component, comprising:
   providing the fused LED component on a component substrate, wherein the fused LED component comprises:
   a first electrode and a second electrode; and
   a plurality of fused LEDs, each fused LED comprising:
      an LED comprising a first LED electrical connection and a second LED electrical connection for providing power to the LED to cause the LED to emit light, wherein the first LED electrical connection electrically connected to the first electrode, and
      a fuse comprising a first fuse electrical connection and a second fuse electrical connection, the first fuse electrical connection electrically connected to the second LED electrical connection and the second fuse electrical connection electrically connected to the second electrode,
   providing a replacement fused LED on the component substrate, wherein the replacement fused LED comprises (i) a replacement LED comprising a first replacement LED electrical connection and a second replacement LED electrical connection and (ii) a replacement fuse comprising a first replacement fuse electrical connection and a second replacement fuse electrical connection; and
   electrically connecting the first replacement LED electrical connection of the replacement LED to the first LED electrical connection of a defective LED and the second replacement LED electrical connection of the replacement LED to the first replacement fuse electrical connection of the replacement fuse,
   wherein the plurality of fused LEDs are electrically connected in parallel,
   wherein at least one of the LEDs in the fused LED component is a defective LED that is electrically shorted; and
   applying electrical power to the first and second electrodes so that each fuse associated with the at least one of the LEDs that is a defective LED is rendered non-conductive.

10. The method of claim 9, comprising:
   providing an electrical jumper comprising a first connection post and a second connection post each having a peak area less than a base area for each non-defective LED in the fused LED component; and
   disposing each electrical jumper in electrical contact with the second electrode and the second electrical connection of each fused LED in the fused LED component.

11. The method of claim 9, comprising:
   providing a light emission standard;
   testing the light output of each LED;
   comparing the light output to the light-emission standard;
   determining if each LED in the LED component meets the standard; and
   for each LED that does not meet the standard, rendering non-conductive at least one of (i) the first and second LED electrical connection of the LED and (ii) the first and second fuse electrical connection of the fuse corresponding to the LED.

12. A fused light-emitting diode (LED) component, comprising:
   a first electrode and a second electrode; and
   a plurality of fused LEDs, each fused LED comprising:
      an LED comprising a first LED electrical connection and a second LED electrical connection for providing power to the LED to cause the LED to emit light, wherein the first LED electrical connection is electrically connected to the first electrode, and
      a fuse comprising a first fuse electrical connection and a second fuse electrical connection, the first fuse electrical connection electrically connected to the second LED electrical connection and the second fuse electrical connection electrically connected to the second electrode,
   wherein the plurality of fused LEDs are electrically connected in parallel,
   wherein the LED of each of the plurality of fused LEDs is a first LED and one or more of the plurality of fused LEDs comprises a second LED comprising a first LED electrical connection and a second LED electrical connection for providing power to the second LED to cause the second LED to emit light,
   wherein, for each fused LED of the one or more of the plurality of fused LEDs, (i) the second LED electrical connection of the first LED is electrically connected to the first LED electrical connection of the second LED so that the first LED and the second LED of the fused LED are electrically connected in series and (ii) all of the current that passes through the first LED and all of the current that passes through the second LED passes through the fuse of the fused LED.

\* \* \* \* \*